United States Patent
Gao

(10) Patent No.: US 12,089,366 B2
(45) Date of Patent: Sep. 10, 2024

(54) SERVER AND COOLING SYSTEM FOR ENHANCED IMMERSION COOLING

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 40 days.

(21) Appl. No.: 17/826,730

(22) Filed: May 27, 2022

(65) Prior Publication Data

US 2023/0389230 A1  Nov. 30, 2023

(51) Int. Cl.
*H05K 7/20* (2006.01)

(52) U.S. Cl.
CPC ......... *H05K 7/20236* (2013.01); *H05K 7/203* (2013.01); *H05K 7/20309* (2013.01); *H05K 7/20327* (2013.01); *H05K 7/20509* (2013.01); *H05K 7/20772* (2013.01); *H05K 7/20809* (2013.01)

(58) Field of Classification Search
CPC .......... H05K 7/20218; H05K 7/20236; H05K 7/20254; H05K 7/20272; H05K 7/2039; H05K 7/20509; H05K 7/20536; H05K 7/20627; H05K 7/20663; H05K 7/20709; H05K 7/20763; H05K 7/208; H05K 7/20772; H05K 7/2078
See application file for complete search history.

(56) References Cited

U.S. PATENT DOCUMENTS

| | | | | |
|---|---|---|---|---|
| 9,313,920 | B2* | 4/2016 | Campbell | F28B 3/04 |
| 10,020,242 | B2* | 7/2018 | Katsumata | H01L 23/44 |
| 10,225,958 | B1* | 3/2019 | Gao | H05K 7/20781 |
| 10,743,438 | B2* | 8/2020 | Wakino | H05K 7/20272 |
| 10,917,995 | B2* | 2/2021 | Tokeshi | F28D 15/00 |
| 11,490,546 | B2* | 11/2022 | Edmunds | H05K 7/20772 |
| 11,729,950 | B2* | 8/2023 | Chehade | H05K 7/208 361/699 |
| 11,805,624 | B2* | 10/2023 | Bean, Jr. | H05K 7/20272 |
| 2019/0150322 | A1* | 5/2019 | Eriksen | H05K 7/20272 361/699 |
| 2021/0185850 | A1* | 6/2021 | Kulkarni | H05K 7/20327 |
| 2022/0248568 | A1* | 8/2022 | Bennett | H05K 7/20836 |
| 2022/0322575 | A1* | 10/2022 | Hnayno | H05K 7/20781 |
| 2022/0369504 | A1* | 11/2022 | Clerc | H05K 7/20236 |
| 2023/0025254 | A1* | 1/2023 | Curtis | H05K 7/20781 |
| 2023/0225076 | A1* | 7/2023 | Shah | H05K 7/20736 361/679.53 |

* cited by examiner

*Primary Examiner* — Zachary Pape
*Assistant Examiner* — Steven Ngo
(74) *Attorney, Agent, or Firm* — WOMBLE BOND DICKINSON (US) LLP

(57) ABSTRACT

Embodiments are disclosed of an immersion cooling device. The immersion cooling device includes a flow module adapted to be coupled to a heat-generating electronic component and immersed in an immersion cooling fluid. The flow module includes a housing with a channel therein, an inlet mounted the housing and fluidly coupled to the channel, the inlet being adapted to be submerged in the immersion cooling fluid, a pump positioned in the channel to accelerate the flow of immersion cooling fluid entering the channel through the inlet, and a fluid distribution interface mounted on the housing and fluidly coupled to the channel.

9 Claims, 7 Drawing Sheets

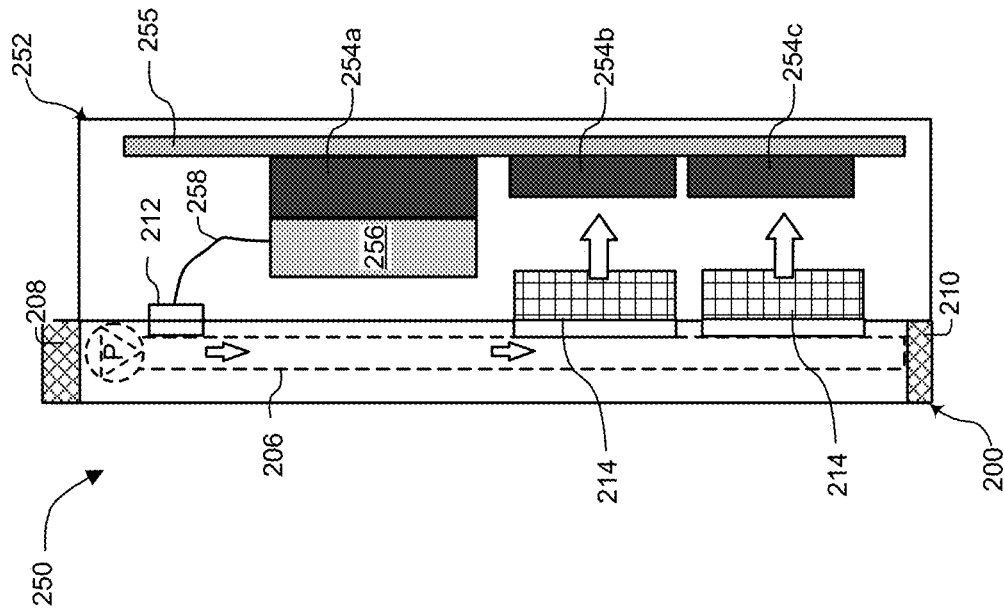
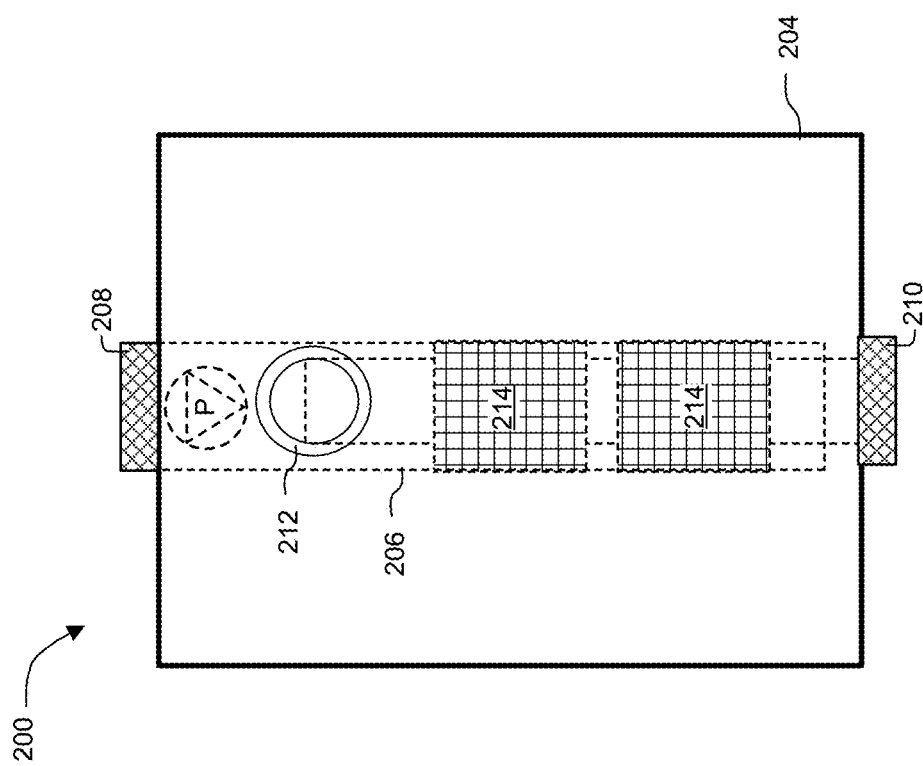
Fig. 2B
Fig. 2A

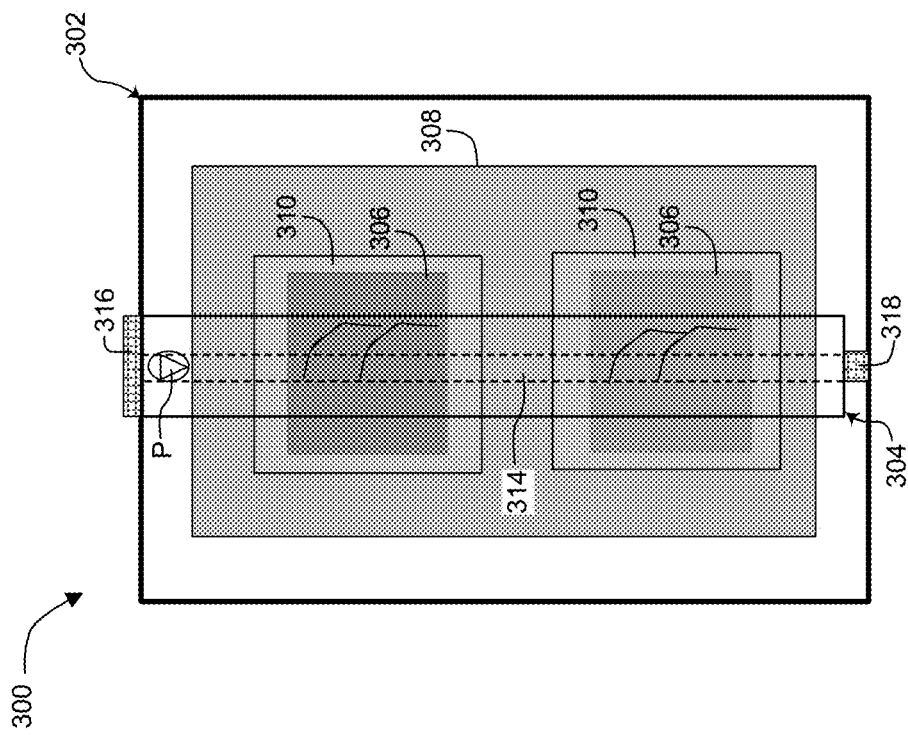
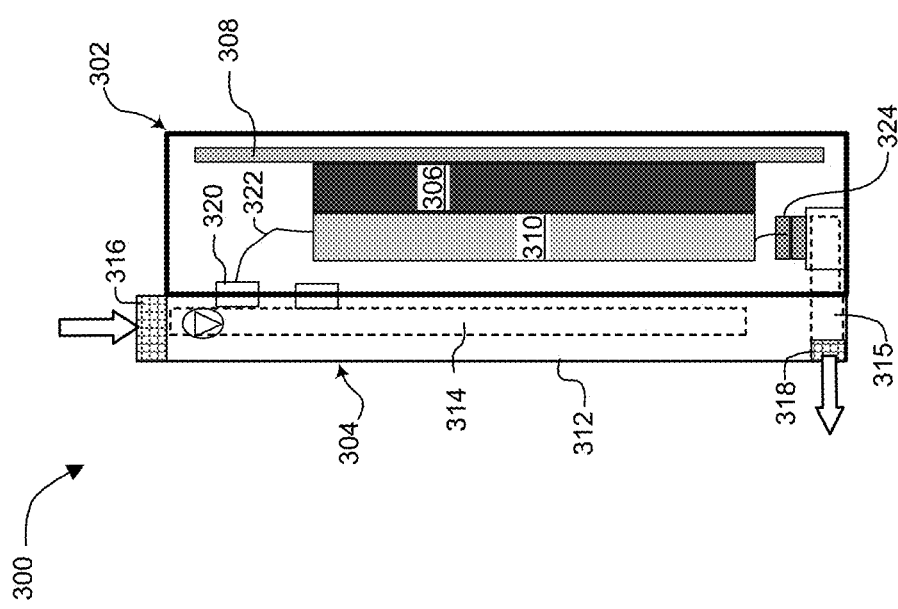
Fig. 3B
Fig. 3A

SERVER AND COOLING SYSTEM FOR ENHANCED IMMERSION COOLING

TECHNICAL FIELD

The disclosed embodiments relate generally to immersion cooling of information technology (IT) equipment and more specifically, but not exclusively, to a server and cooling system for enhanced immersion cooling.

BACKGROUND

Modern data centers like cloud computing centers house enormous amounts of information technology (IT) equipment such as servers, blade servers, routers, edge servers, power supply units (PSUs), battery backup units (BBUs), etc. Individual pieces of IT equipment are typically housed in racks within the computing center, with multiple pieces of IT equipment in each rack. The racks are typically grouped into clusters within the data center.

As IT equipment has become more computationally powerful it also consumes more electricity and generates more heat that must be removed from the IT equipment to keep it operating properly. Various cooling solutions have been developed to keep up with this increasing need for heat removal. One solution is immersion cooling, in which the IT equipment is itself submerged in an immersion cooling fluid. The immersion cooling fluid can be a single-phase or two-phase cooling fluid; in either case, heat from the IT equipment is transferred into the cooling fluid in which it is submerged. But existing immersion solutions do not handle high-power components efficiently, as a result of which they do not sufficiently support high power density servers. Such immersion solutions are also inefficient and may not be a good solution for hyperscale deployment.

BRIEF DESCRIPTION OF THE DRAWINGS

Non-limiting and non-exhaustive embodiments of the invention are described below with reference to the following figures, wherein like reference numerals refer to like parts throughout the various views unless otherwise specified.

FIG. 1A is an exploded view, FIG. 1B an assembled view.

FIG. 2A is a top view of an embodiment of an immersion cooling device.

FIG. 2B is a side view of an embodiment of a server using the immersion cooling device of FIG. 2A.

FIGS. 3A-3B are a side view and a top view, respectively, of a server using an embodiment of an immersion cooling device.

DETAILED DESCRIPTION

Figure 1A:
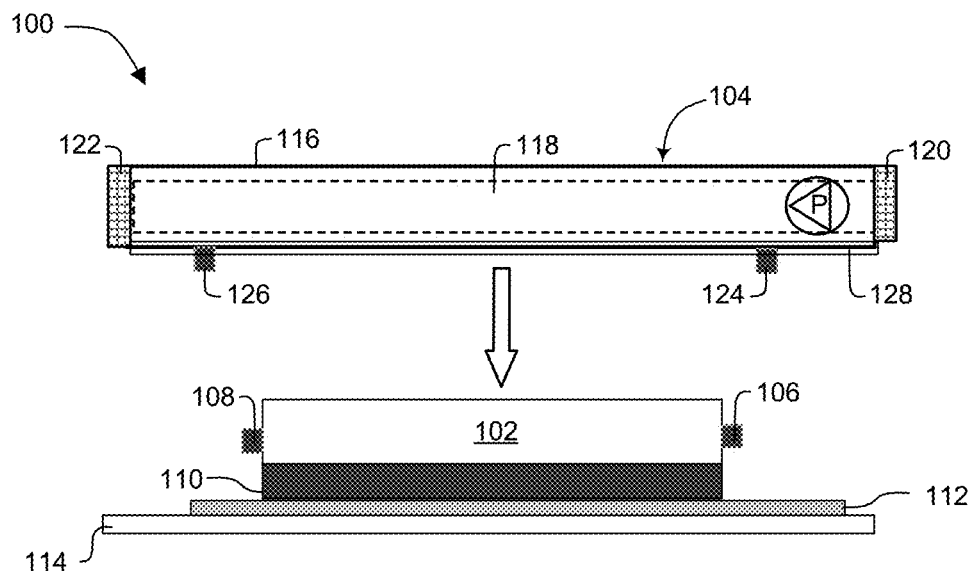
FIGS. 1A-1B are side views of an embodiment of an immersion-cooled server.

Embodiments are described of an immersion cooling device and system for enhanced immersion cooling of servers. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in de-tail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the described features, structures, or characteristics can be combined in any suitable manner in one or more embodiments. As used in this application, directional terms such as "front," "rear," "top," "bottom," "side," "lateral," "longitudinal," etc., refer to the orientations of embodiments as they are presented in the drawings, but any directional term should not be interpreted to imply or require a particular orientation of the described embodiments when in actual use.

Embodiment are described below of a server design architecture for designing and operating high power density chips and servers in different immersion environments with high efficiency. The embodiments enable high performance and efficiency thermal management of the increasing power density of the chips and servers.

The described embodiments include a high-availability flow module for managing immersion fluid streams. The flow module includes direct inlet and outlet ports designed to be submerged in an immersion cooling fluid. The flow module includes an adapting surface to be used for either connecting with a server cooling device or providing cooling streams directly to heat-generating components. The internal design of the flow module includes an active immersion fluid mover and a dedicated channel. In an embodiment, the design is used for operating in single-phase environment or two-phase environment. In an embodiment, the cooling devices for the heat-generating components are packaged on the flow module. Features and benefits of the disclosed embodiments include:

Solving server hot spots in a submerged environment.
Increasing fluid management power usage efficiency.
High power density chips thermal management.
Efficient phase change management and cooling design.
Accommodate different server hardware, chips, processors, and configurations.
Localized precision cooling design and management.
Ease of deployment, operation, and service.
Expandable for future power and density increasing.
High interoperability among different thermal environments.

In one aspect the immersion cooling device includes a flow module adapted to be coupled to a heat-generating electronic component and immersed in an immersion cooling fluid. The flow module includes a housing with a channel. An inlet is mounted to the housing and fluidly coupled to the channel, the inlet being adapted to be submerged in the immersion cooling fluid. A pump is positioned in the channel to accelerate the flow of immersion cooling fluid entering the channel through the inlet, and a fluid distribution interface mounted on the housing and fluidly coupled to the channel.

One embodiment further comprises a cooling device thermally coupled to the heat-generating electronic component and fluidly coupled to the fluid distribution interface. In an embodiment the fluid distribution interface includes an outlet and the cooling device includes an inlet, the outlet of the fluid distribution interface being fluidly coupled to the inlet of the cooling device. In another embodiment the fluid distribution interface includes an inlet and the cooling device includes an outlet, the outlet of cooling device the being fluidly coupled to the inlet of the fluid distribution interface. In yet another embodiment the outlet of the fluid distribution interface is fluidly coupled to the inlet of the cold plate by a flexible fluid line and the outlet of the cold plate is fluidly coupled to the inlet of the fluid distribution interface by a flexible fluid line.

Another embodiment further includes an adapting surface to position the cooling device on the housing and to provide fluid connectors for the fluid distribution interface. In another embodiment the fluid distribution interface includes a vent that directs immersion cooling fluid from the channel to impinge on the heat-generating electronic component. In yet another embodiment the immersion cooling fluid is a two-phase fluid, wherein the housing is positioned vertically with the inlet at the top of the housing and the fluid distribution interface at the bottom of the housing, and further comprising an evaporator with a liquid inlet and a vapor outlet, the liquid inlet of the evaporator being fluidly coupled the fluid distribution interface. In an embodiment the vapor outlet is adapted to be positioned above a surface of the liquid phase of the two-phase fluid.

In another aspect the immersion cooling device includes a cooling device adapted to be thermally coupled to a heat-generating electronic component. A flow module is adapted to be fluidly coupled to the cooling device, the flow module and the cooling device both being adapted to be submerged in an immersion cooling fluid. The flow module includes a housing with a channel. An inlet is mounted on the housing and fluidly coupled to the channel, the inlet being adapted to be submerged in the immersion cooling fluid. A pump is positioned in the channel to accelerate the flow of immersion cooling fluid entering the channel through the inlet, and a fluid distribution interface is mounted on the housing and fluidly coupled to the channel and to the cooling device.

In an embodiment the cooling device is a cold plate including an inlet, the fluid distribution interface includes an outlet, and the outlet of the fluid distribution interface is fluidly coupled to the inlet of the cold plate. In another embodiment the fluid distribution interface includes an inlet and the cold plate includes an outlet, the outlet of cooling device the being fluidly coupled to the inlet of the fluid distribution interface. In still another embodiment the immersion cooling fluid is a two-phase fluid, the cooling device is an evaporator with a liquid inlet and a vapor outlet, the housing is positioned vertically with the inlet at the top of the housing and the fluid distribution interface at the bottom of the housing, the fluid distribution interface including a liquid outlet, and the liquid inlet of the evaporator is fluidly coupled the liquid outlet of the fluid distribution interface. In another embodiment the vapor outlet is adapted to be positioned above a surface of the liquid phase of the two-phase fluid.

In one aspect an immersion cooling system includes an information technology (IT) container having therein an immersion cooling fluid. An immersion-cooled server is submerged in the immersion cooling fluid, the server including at least one heat-generating component. A cooling device is adapted to be thermally coupled to the heat-generating component and a flow module is adapted to be fluidly coupled to the cooling device and immersed in the immersion cooling fluid. The flow module includes a housing with a channel therein, an inlet mounted on the housing and fluidly coupled to the channel, the inlet being adapted to be submerged in the immersion cooling fluid, a pump positioned within the channel to accelerate the flow of immersion cooling fluid entering the channel through the inlet, and a fluid distribution interface mounted on the housing and fluidly coupled to the channel.

One embodiment further includes a cooling device adapted to be thermally coupled to the heat-generating electronic component. The cooling device is a cold plate including an inlet, the fluid distribution interface includes an outlet; and the outlet of the fluid distribution interface is fluidly coupled to the inlet of the cold plate. In another embodiment the fluid distribution interface includes an inlet and the cold plate includes an outlet, the outlet of cooling device the being fluidly coupled to the inlet of the fluid distribution interface.

Another embodiment further includes a cooling device adapted to be thermally coupled to the heat-generating electronic component. The immersion cooling fluid is a two-phase fluid and the cooling device is an evaporator with a liquid inlet and a vapor outlet, the housing is positioned vertically with the inlet at the top of the housing and the fluid distribution interface at the bottom of the housing, the fluid distribution interface including a liquid outlet, and the liquid inlet of the evaporator is fluidly coupled the liquid outlet of the fluid distribution interface. In another embodiment the vapor outlet is adapted to be positioned above a surface of the liquid phase of the two-phase fluid. And in yet another embodiment at least one of the one or more fluid distribution interfaces is a vent that directs immersion cooling fluid from the channel to impinge on the heat-generating electronic component.

Figure 1B:
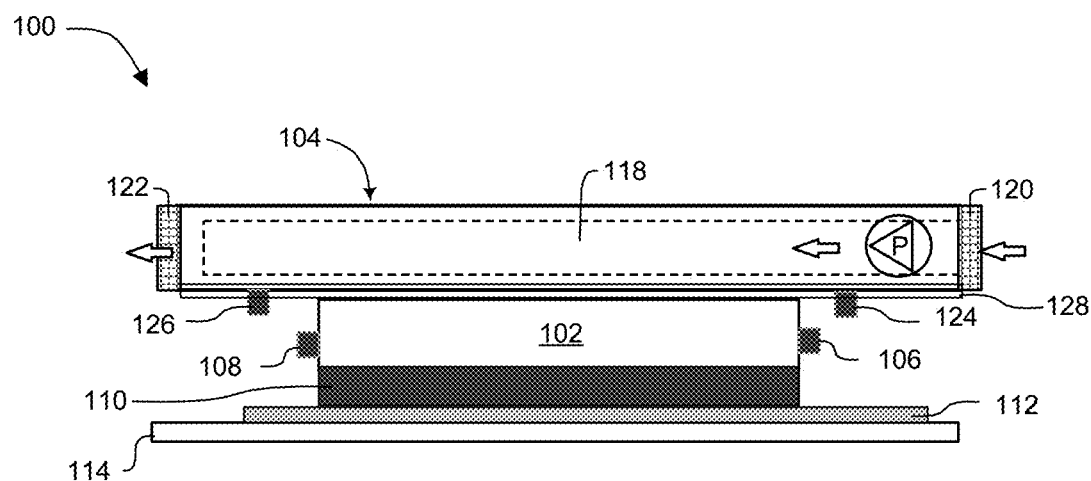

FIGS. 1A-1B together illustrate an embodiment of an immersion-cooled server 100. FIG. 1A is an exploded view, FIG. 1B an assembled view. Device 100 includes a cooling device 102 fluidly coupled to a flow module 104. The illustrated embodiment of cooling device 102 and flow module 104 are together designed to be submerged in a single-phase immersion cooling fluid, but other embodiments of the cooling device (see, e.g., FIG. 6) can be used with a two-phase immersion cooling fluid.

Cooling device 102 has two fluid interfaces—inlet fitting 106 and outlet fitting 108—and internal channels (not shown) that allow fluid to flow into the cooling device through inlet fitting 106, through the cooling device from inlet to outlet, and out of the cooling device through outlet fitting 108. The cooling device is adapted to be thermally coupled to a heat-generating electronic component 110. Although the illustrated embodiment shows electronic component 110 as a single unit, in other embodiments electronic component 110 can include multiple units, so that cooling device 102 is thermally coupled to multiple heat-generating components 110 at a time. Examples of heat-generating electronic component 110 include microprocessors, co-processors, display drivers, memory, etc. Electronic component 110 is mounted on one or more supporting substrates such as a printed circuit board (PCB) 112 and board 114.

Flow module 104 includes a housing 116 with an internal channel 118. An inlet 120 is fluidly coupled to channel 118 and, depending on the nature of the fluid distribution interface, some embodiments of flow module 104 can also include an outlet 122 fluidly coupled to channel 118. Inlet 120 and outlet 122 are directly in contact with the immersion cooling fluid. A pump P or other fluid-moving device is positioned in flow module 104 to draw cooling fluid through inlet 120 and push the cooling fluid through internal channel 118. In the illustrated embodiment pump P is internal to flow module 104, but in other embodiments pump P can be external to the flow module.

Flow module 104 also includes a fluid distribution interface, the nature of which can be different in different embodiments, depending on how cooling fluid is to be distributed. In the illustrated embodiment the fluid distribution interface includes a fluid outlet fitting 124 and a fluid inlet fitting 126. Outlet fitting 124 is designed to be coupled to inlet fitting 106 and inlet fitting 126 is designed to be coupled to outlet fitting 108, so that flow module 104 provides fluid directly to cooling device 102 through the fluid distribution interface. For different server hardware and thermal systems, the fluid distribution interface can be realized in different ways.

An adapting layer 128 is positioned on the surface of housing 116 that will mate with cooling device 102 when the cooling device 102 and flow module 104 are assembled as shown in FIG. 1B. Adapting layer 128, as its name suggests, adapts flow module 104 to cooling device 102, including provisions to securely accommodate the surface of cooling device 102 and to provide locations for fluid connectors 124 and 126.

Figure 5:
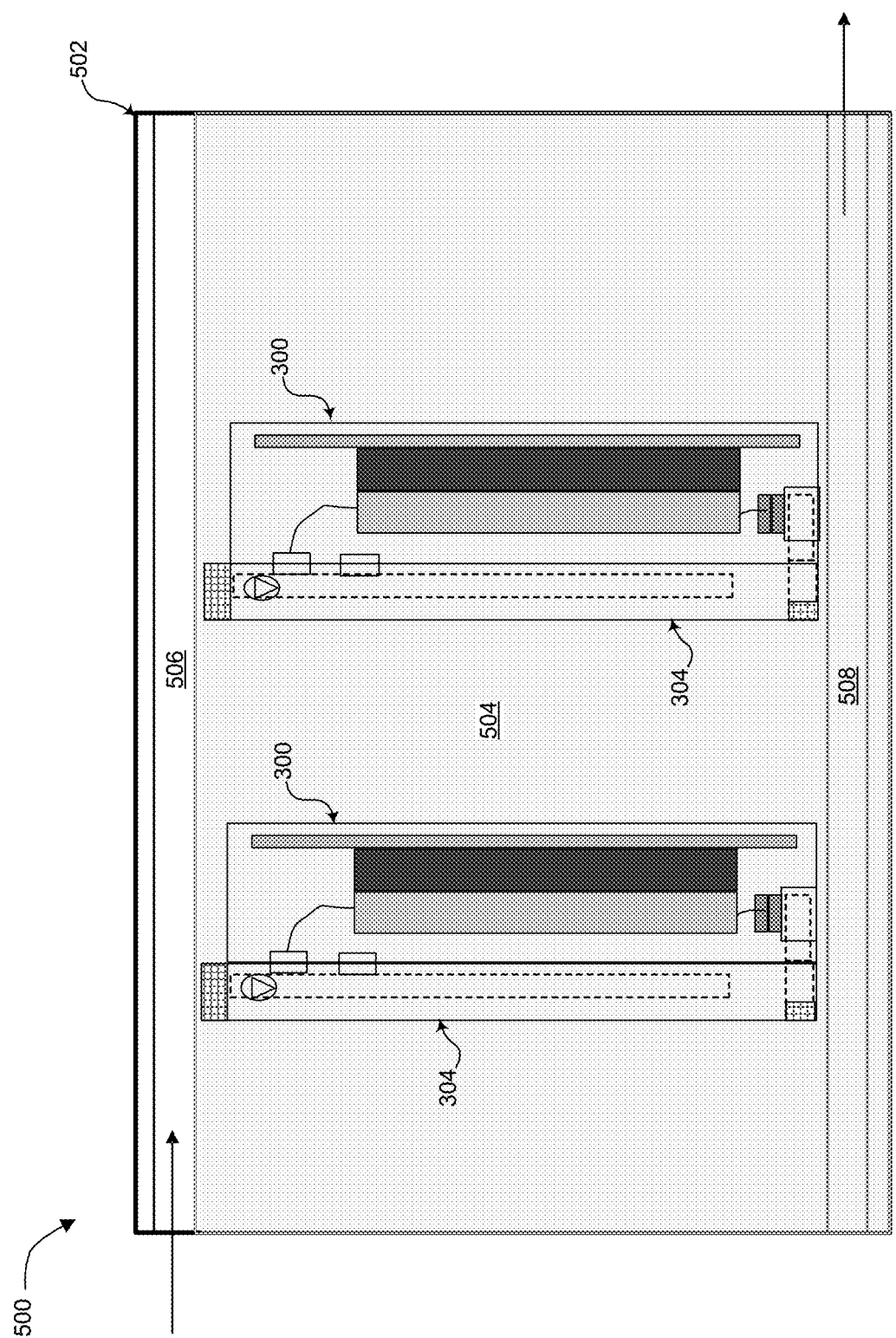
FIG. 5 is a side view of an embodiment of an information technology (IT) enclosure with multiple servers having immersion cooling devices.

In operation, when immersion-cooled server 100 is assembled and thermally coupled to heat-generating electronic component 102, as shown in FIG. 1B, the entire assembly is submerged in an immersion cooling fluid (see, e.g., FIG. 5). Immersion-cooled server 100 is positioned in the immersion cooling fluid such that inlet 120, and outlet 122 is present, are fully submerged in the cooling fluid—i.e., both are beneath the surface of the cooling fluid. Once immersion-cooled server 100 is submerged in the immersion cooling fluid, pump P begins to operate, drawing fluid through inlet 120, directing it out through outlet fitting 124 and into cooling device 102. The fluid circulates through cooling device 102, where it absorbs heat from heat-generating electrical component 110. The heated fluid exits cooling device 102 through outlet 108 and reenters flow module 104 through inlet fitting 126. Cooling fluid reentering flow module 104 through inlet fitting 126, as well as any fluid that entered internal channel 118 but did not exit through outlet fitting 124, exits flow module 104 through outlet 122 back into the immersion cooling fluid in which server 100 is submerged.

Figure 1C:
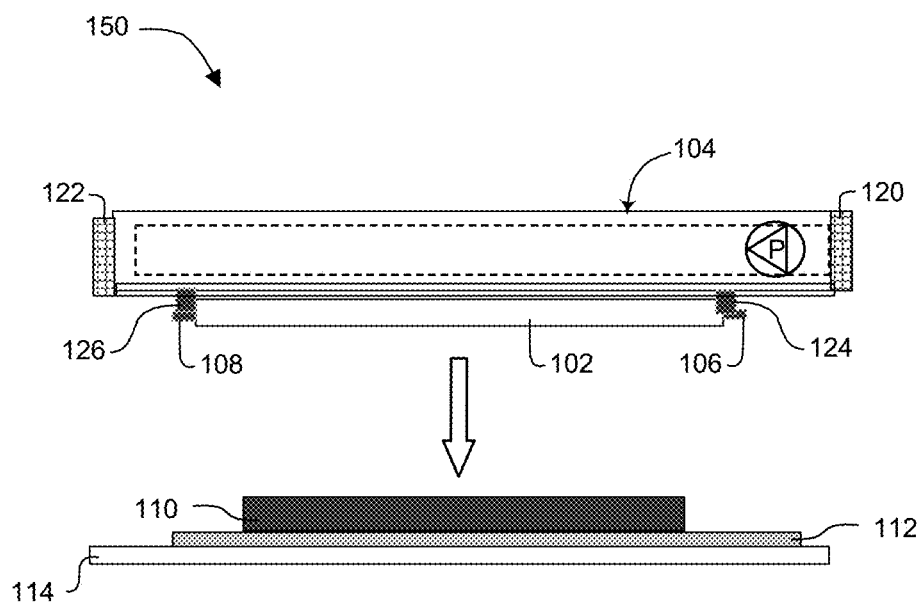
FIG. 1C is an exploded side view of another embodiment of an immersion-cooled server.

FIG. 1C illustrates another embodiment of an immersion-cooled server 150. Server 150 is in most respects similar to server 100: it includes a flow module 104 coupled to a cooling device 102, both of which are then coupled to a heat-generating electronic component 110 with cooling device 102 thermally coupled to electronic component 110. The primary difference between immersion-cooled servers 150 and 100 is that in server 150 cooling device 102 is integrated with flow module 104—that is, cooling device 102 and flow module 104 are assembled and the fluid connections between the flow module and the cooling device are made beforehand. The combination of cooling device 102 and flow module 104 can then be thermally coupled to heat-generating device 110. Immersion-cooled server 150 operates as described above for immersion-cooled server 100.

FIGS. 2A-2B illustrate another embodiment of an immersion-cooled server. FIG. 2A illustrates the construction of a flow module 200 and FIG. 2B illustrates its use in cooling a server 250 in a single-phase immersion cooling scenario. As shown in FIG. 2A, flow module 200 includes a housing 204 with an internal channel 206. An inlet 208 is fluidly coupled to internal channel 206 and this embodiment, because of its fluid distribution interface (see below), can have, but need not have, outlet 210 fluidly coupled to channel 206. Pump P is positioned in housing 204 to draw cooling fluid into inlet 208 and direct it into and through channel 206. In the illustrated embodiment pump P is shown internal to module 200, but in other embodiments pump P can be external to the flow module. Although not visible in this figure because it is a top view, flow module 200 can also include an adapting layer positioned on a surface of housing 204 to adapt flow module 200 to cooling device 256. The adapting layer can, for instance, include provisions to securely mate with the surface of cooling device 256 and provide a location for connector 212.

Flow module 200 has a fluid distribution interface different than the fluid distribution interface of flow module 104. In the illustrated embodiment the fluid distribution interface includes a fluid outlet fitting 212 that can be directly coupled to a cooling device (see FIG. 2B), similar to fittings 124 in flow module 104, to provide fluid directly to the cooling device 102. As part of its fluid distribution interface, flow module 200 also includes a pair of vents 214 through which cooling fluid can exit from channel 206.

FIG. 2B illustrates an embodiment of an immersion-cooled server 250 using flow module 200. As mentioned above for immersion-cooled server 100, the entire assembly 250 will be submerged in a single-phase immersion cooling fluid, with inlet 208 and outlet 210, if present, both below the fluid surface. Server 250 includes multiple heat-generating electronic components 254a-254c mounted to a substrate 255 such as a printed circuit board. A cooling device 256, such as a cold plate, is thermally coupled to heat-generating component 254a. Heat-generating components 254b and 254c are not thermally coupled to a cold plate.

Flow module 200 is positioned on server 252 so that fitting 212 can be used to couple the flow module to an inlet of cold plate 256 with a flexible fluid line 258. In this embodiment the outlet of cold plate 256 is not fluidly coupled to flow module 200, so that cooling fluid exiting cold plate 256 returns to the surrounding cooling fluid instead of being directed back into the flow module. In other embodiments the outlet of cooling plate 256 can be coupled to flow module 200, for instance as shown in FIG. 1B. Heat-generating components 254b and 254c are each substantially aligned with a vent 214. During operation, flow module 200 draws immersion cooling fluid into channel 206 and expels it through vents 214 so that fluid exiting vents 214 impinges directly on heat-generating components 254b-254c, creating forced convection of the immersion fluid over the heat-generating components and helping to cool them.

FIGS. 3A-3B together illustrate an embodiment of an immersion-cooled server 300. FIG. 3A is a side view, FIG. 3B a top view. Immersion-cooled server 300 includes a server 302 coupled to a flow module 304. Server 302 includes one or more heat-generating electronic components 306 mounted to a substrate 308 such as a printed circuit board. A cooling device 310, such as a cold plate, is thermally coupled to each heat-generating component 306. Cooling device 310 and heat-generating component 306 are represented as a single unit in FIG. 3A, but can actually be multiple units as shown in FIG. 3B.

Flow module 304 is positioned on server 302 and has a housing 312 with an internal channel 314 and a separate internal channel 315. An inlet 316 is fluidly coupled to channel 314 and an outlet 318 is fluidly coupled to channel 315. Pump P is positioned in flow module 304 to draw cooling fluid into inlet 316 and push it through channel 314.

Flow module 304's fluid distribution interface includes outlet fitting 320, designed to be directly coupled to the inlet of cold plate 310 by flexible fluid line 322. A fluid inlet fitting 324 is similarly fluidly coupled the outlet of cold plate 310 by a flexible fluid line. Inlet fitting 324 is fluidly coupled to channel 315.

In operation, server 300 is positioned in the immersion cooling fluid so that inlet 316 and outlet 318 are fully submerged in the cooling fluid—i.e., both are beneath the fluid's surface. Pump P draws fluid through inlet 316 into channel 314 and through outlet fitting 320 into cold plate 310. The fluid circulates through cold plate 310 and absorbs heat from heat-generating electrical component 306. The heated cooling fluid exits through the outlet of cold plate 310 and enters flow channel 315 through inlet fitting 324. Cooling fluid entering channel 315 then exits through outlet 318 back into the immersion cooling fluid in which server 300 is submerged.

Figure 4:
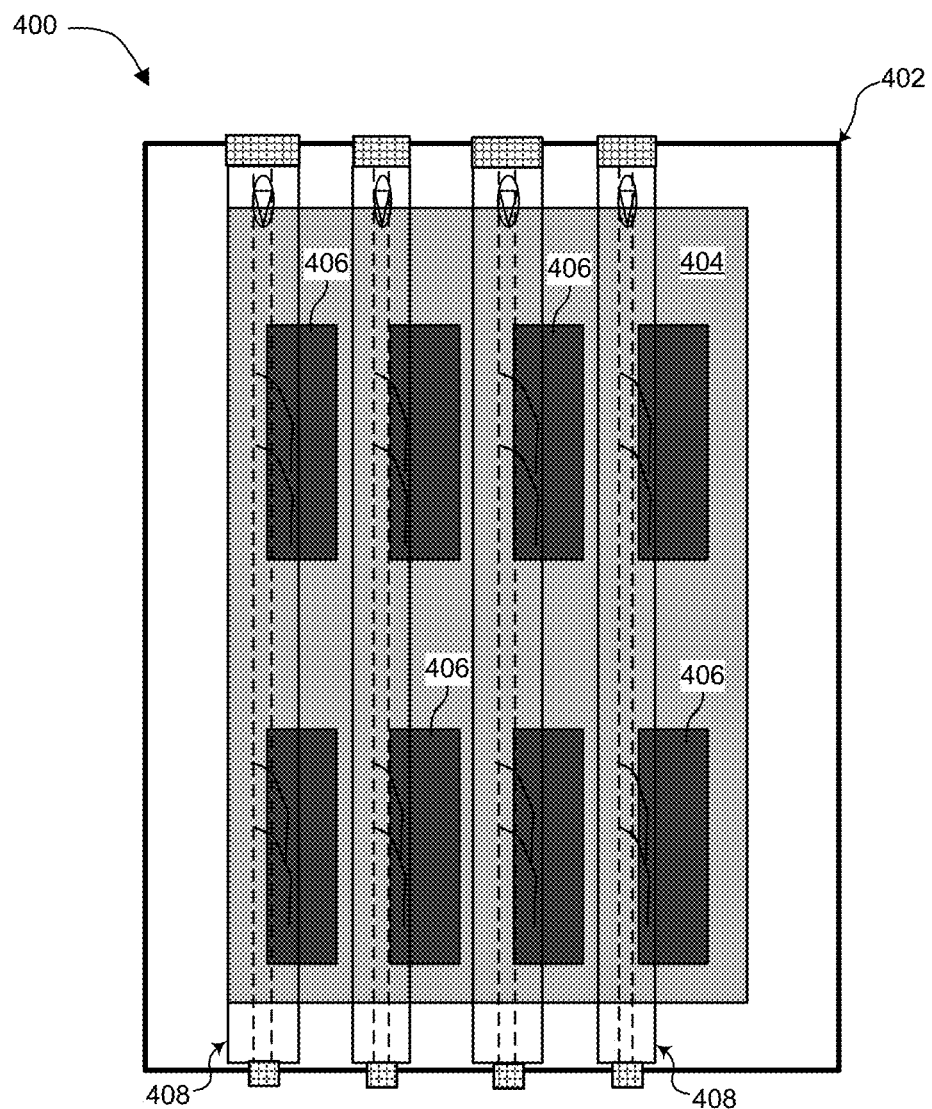
FIG. 4 is a top view of an embodiment of a high-density server using multiple immersion cooling devices.

FIG. 4 illustrates an embodiment of an immersion-cooled server 400 with multiple high-power heat-generating electronic devices. Immersion-cooled server 400 includes a server with a printed circuit board 404. Printed circuit board 404 has multiple densely-packed high-power heat-generating components 406 mounted on it. In one embodiment heat-generating components 406 can be PCIE based high power density devices such as AI accelerators. Multiple flow modules 408 are coupled to server 402. In the illustrated embodiment each flow module 408 is fluidly coupled to two heat-generating components 406, but in other embodiments each flow flayer 408 can be fluidly coupled to more or less heat-generating components than shown. In one embodiment each flow module 408 can be fluidly coupled as illustrated in FIGS. 3A-3B to a corresponding cooling devices, but in other embodiments the fluid coupling can be done differently, for instance as shown in FIGS. 2A-2B. Also in the illustrated embodiment all flow modules 408 are the same, but in other embodiments all flow modules 408 need not be the same.

FIG. 5 illustrates an embodiment of an information technology (IT) enclosure 500 with immersion cooling. IT enclosure 500 includes an IT container 502 that is at least partially filled with a single-phase immersion cooling fluid 504. One or more immersion-cooled servers 300 are positioned in IT container 502 and submerged in immersion cooling fluid 504. As described above, immersion-cooled servers 300 are submerged so that the inlet and outlet of their flow modules are both below the surface of immersion cooling fluid 504. The illustrated embodiment has two immersion-cooled servers 300, but in other embodiments IT container 502 can house more or less servers than shown. Other embodiments of immersion-cooled IT enclosure 500 can of course use different embodiments of immersion-cooled servers—server 250 shown in FIG. 2B, for instance. In the illustrated embodiment all the immersion-cooled servers are the same, but in other embodiments not all servers within IT container 502 need be the same.

In addition to immersion-cooled servers 300, IT container 502 includes a fluid supply manifold 506 and a fluid return manifold 508. Fluid supply manifold 506 is positioned at the top of the container and fluid return manifold 508 is positioned at the bottom of container 502 and submerged in immersion cooling fluid 504, so that immersion cooling fluid can enter IT container 502 through the supply manifold and exit the container through the return manifold. During operation, immersion-cooled servers 300 operate as described above. Fluid supply manifold 506 and fluid return manifold 508 circulate and refresh immersion-cooling fluid 504, as well as ensuring that the level of immersion fluid in container 502 remains constant so that the inlets and outlets of flow modules 304 always remain below the surface of immersion cooling fluid 504. This design provides an efficient co-design of the servers and their IT enclosure for managing single-phase streams.

Figure 6:
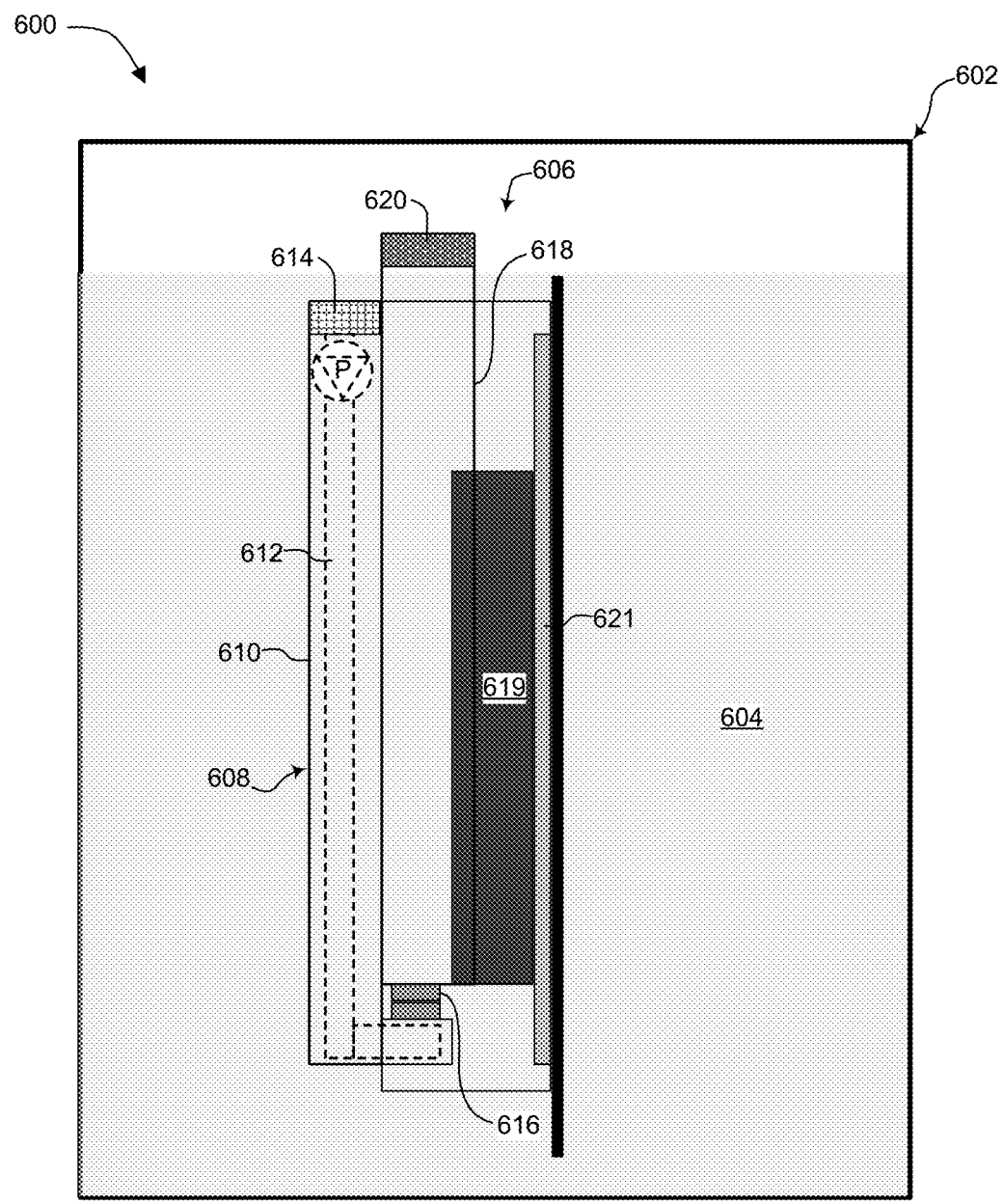
FIG. 6 is a side view of an IT enclosure with an embodiment of an immersion cooling device for use with two-phase immersion cooling.

FIG. 6 illustrates an embodiment of an information technology (IT) enclosure 600 with immersion cooling. IT enclosure 600 is similar to immersion-cooled IT enclosure 500, except that it uses a two-phase immersion cooling fluid instead of a single-phase immersion cooling fluid.

IT enclosure 600 includes an IT container 602 that is at least partially filled with a two-phase immersion cooling fluid 604. An immersion-cooled server 606 is positioned in IT container 502 and partially submerged in immersion cooling fluid 604. The illustrated embodiment has one immersion-cooled server 606, but in other embodiments IT container 602 can house more or less servers than shown. Server 606 includes one or more heat-generating electronic components 619 mounted to a substrate 621 such as a printed circuit board. Heat-generating component 619 is represented in the figure as a single unit, but can actually be multiple units.

The use of a two-phase cooling fluid requires a different type of cooling device thermally coupled to the heat-generating components. In the illustrated embodiment a cooling device 618 with a vapor outlet 620 is thermally coupled to heat-generating component 619. Cooling device 618 uses heat from the heat-generating component to transform two-phase immersion cooling fluid from its liquid phase to its vapor phase. In one embodiment cooling device 618 is an evaporator, but in other embodiments it can be a different type of device. In the illustrated embodiment heat-generating component 619 is in direct contact with fluid inside cooling device 618, but in other embodiments heat-generating component 619 can be thermally coupled to cooling device 618 in a way that avoids direct fluid contact.

Immersion-cooled server 606 includes a flow module 608 with a housing 610 having an internal channel 612. An inlet 614 is fluidly coupled to channel 612 and a pump P is positioned in flow module 608 to draw cooling fluid into inlet 614 and push it through channel 612. In the illustrated embodiment pump P is internal to flow module 608, but in other embodiments pump P can be external to the flow module. Flow module 608 also includes a fluid distribution interface. In the illustrated embodiment the fluid distribution interface is a fluid outlet fitting 616. Fluid outlet fitting 616 is fluidly coupled to the bottom of cooling device 618.

During operation, immersion-cooled server 606 is positioned so that inlet 614 is below the surface of two-phase cooling fluid 604 but outlet 620 is above the surface of the cooling fluid. In other words, inlet 614 is submerged but outlet 620 is not. Pump P draws liquid-phase fluid into channel 612 through inlet 614 and directs it through outlet fitting 616 into the bottom of cooling device 618. The liquid-phase fluid entering cooling device 618 is heated by heat-generating component 619 and is transformed to its vapor phase. The vapor phase then exits cooling device 618 through outlet 620 into IT container 602. Although not shown in this figure, some embodiments of IT enclosure 600 can include an internal or external condenser to transform the vapor phase back into liquid phase and return it to the bottom of container 602. In embodiments without a condenser, the level of two-phase cooling fluid in IT container can be managed as shown in FIG. 5, with supply and return manifolds that can be used to maintain a constant level of two-phase cooling fluid in the IT container so that inlet 614 remains below the surface and outlet 620 remains above.

Other embodiments are possible besides the ones described above. For instance:
- The servers can be designed in different configurations and different form factors.
- The cooling module can be optimized based on the chip or electronics design.
- The IT enclosure for containing the immersion fluid can be different.

The above description of embodiments is not intended to be exhaustive or to limit the invention to the described forms. Specific embodiments of, and examples for, the invention are described herein for illustrative purposes, but various modifications are possible.

What is claimed is:

1. An immersion cooling device comprising:
   a flow module adapted to be coupled to a heat-generating electronic component and immersed in an immersion cooling fluid, the flow module including:
   - a housing, having an interior and an exterior, the interior having a channel therein and the exterior having a mating surface,
   - an inlet mounted the housing and fluidly coupled to the channel, the inlet being adapted to be submerged in the immersion cooling fluid,
   - a pump positioned in the channel to accelerate a flow of the immersion cooling fluid entering the channel through the inlet, and
   - a fluid distribution interface mounted on the housing and fluidly coupled to the channel; and
   a cooling device thermally coupled to the heat-generating electronic component, mated to the mating surface, and fluidly coupled to the fluid distribution interface.

2. The immersion cooling device of claim 1 wherein the fluid distribution interface includes an outlet and the cooling device includes an inlet, the outlet of the fluid distribution interface being fluidly coupled to the inlet of the cooling device.

3. The immersion cooling device of claim 2 wherein the fluid distribution interface includes an inlet and the cooling device includes an outlet, the outlet of the cooling device being fluidly coupled to the inlet of the fluid distribution interface.

4. An immersion cooling device comprising:
   a cooling device adapted to be thermally coupled to a heat-generating electronic component;
   a flow module adapted to be fluidly coupled to the cooling device, the flow module and the cooling device both being adapted to be submerged in an immersion cooling fluid, and the flow module including:
   - a housing having an interior and an exterior, the interior having a channel therein and the exterior having a mating surface mated to the cooling device,
   - an inlet mounted on the housing and fluidly coupled to the channel, the inlet being adapted to be submerged in the immersion cooling fluid,
   - a pump positioned in the channel to accelerate a flow of the immersion cooling fluid entering the channel through the inlet, and
   - a fluid distribution interface mounted on the housing and fluidly coupled to the channel and to the cooling device.

5. The immersion cooling device of claim 4 wherein:
   the cooling device is a cold plate including an inlet;
   the fluid distribution interface includes an outlet; and
   the outlet of the fluid distribution interface is fluidly coupled to the inlet of the cold plate.

6. The immersion cooling device of claim 5 wherein the fluid distribution interface includes an inlet and the cold plate includes an outlet, the outlet of the cooling device being fluidly coupled to the inlet of the fluid distribution interface.

7. An immersion cooling system comprising:
   an information technology (IT) container having therein an immersion cooling fluid;
   an immersion-cooled server submerged in the immersion cooling fluid, the server including at least one heat-generating component;
   a flow module adapted to be immersed in the immersion cooling fluid, the flow module including:
   - a housing having an interior and an exterior, the interior having a channel therein and the exterior having a mating surface,
   - an inlet mounted on the housing and fluidly coupled to the channel, the inlet being adapted to be submerged in the immersion cooling fluid,
   - a pump positioned within the channel to accelerate a flow of the immersion cooling fluid entering the channel through the inlet,
   - a fluid distribution interface mounted on the housing and fluidly coupled to the channel; and
   a cooling device thermally coupled to the heat-generating component, mated to the mating surface, and fluidly coupled to the flow module.

8. The immersion cooling system of claim 7, wherein:
   the cooling device is a cold plate including an inlet;
   the fluid distribution interface includes an outlet; and
   the outlet of the fluid distribution interface is fluidly coupled to the inlet of the cold plate.

9. The immersion cooling system of claim 8 wherein the fluid distribution interface includes an inlet and the cold plate includes an outlet, the outlet of the cooling device being fluidly coupled to the inlet of the fluid distribution interface.

* * * * *